(12) United States Patent
Chao et al.

(10) Patent No.: US 7,297,628 B2
(45) Date of Patent: Nov. 20, 2007

(54) DYNAMICALLY CONTROLLABLE REDUCTION OF VERTICAL CONTACT DIAMETER THROUGH ADJUSTMENT OF ETCH MASK STACK FOR DIELECTRIC ETCH

(75) Inventors: Chunyuan Chao, Fremont, CA (US); Kuei-Chang Tsai, Cupertino, CA (US); George A. Kovall, Campbell, CA (US)

(73) Assignee: Promos Technologies, Inc., Hsinchu (TW)

( * ) Notice: Subject to any disclaimer, the term of this patent is extended or adjusted under 35 U.S.C. 154(b) by 196 days.

(21) Appl. No.: 10/718,320

(22) Filed: Nov. 19, 2003

(65) Prior Publication Data

US 2005/0106882 A1    May 19, 2005

(51) Int. Cl.
 *H01L 21/4763*  (2006.01)
(52) U.S. Cl. ............... 438/635; 438/636; 438/637; 438/638; 438/639; 438/640; 438/714; 438/717; 438/723; 438/724; 438/725
(58) Field of Classification Search ............... None
See application file for complete search history.

(56) References Cited

U.S. PATENT DOCUMENTS

| | | | |
|---|---|---|---|
| 5,629,237 A | 5/1997 | Wang et al. | |
| 5,753,418 A * | 5/1998 | Tsai et al. | 430/313 |
| 6,171,951 B1 * | 1/2001 | Lee et al. | 438/640 |
| 6,329,109 B1 | 12/2001 | Figura et al. | |
| 6,383,863 B1 | 5/2002 | Chiang et al. | |
| 6,387,798 B1 * | 5/2002 | Loke et al. | 438/623 |
| 6,514,868 B1 * | 2/2003 | Hui et al. | 438/713 |
| 6,613,686 B2 * | 9/2003 | Nishizawa | 438/710 |
| 2002/0142610 A1 * | 10/2002 | Chien et al. | 438/710 |
| 2002/0173162 A1 * | 11/2002 | Liu et al. | 438/732 |

* cited by examiner

*Primary Examiner*—Duy-Vu N Deo
(74) *Attorney, Agent, or Firm*—MacPherson Kwok Chen & Heid LLP

(57) ABSTRACT

Inwardly-tapered openings are created in an Anti-Reflection Coating layer (ARC layer) provided beneath a patterned photoresist layer. The smaller, bottom width dimensions of the inwardly-tapered openings are used for defining further openings in an interlayer dielectric region (ILD) provided beneath the ARC layer. In one embodiment, the ILD separates an active layers set of an integrated circuit from its first major interconnect layer. Further in one embodiment, a taper-inducing etch recipe is used to create the inwardly-tapered ARC openings, where the etch recipe uses a mixture of CF4 and CHF3 and where the CF4/CHF3 volumetric inflow ratio is substantially less than 5 to 1, and more preferably closer to 1 to 1.

33 Claims, 11 Drawing Sheets

201
PHOTORESIST DEVELOPMENT

202
SLOPED OPENING OF ARC

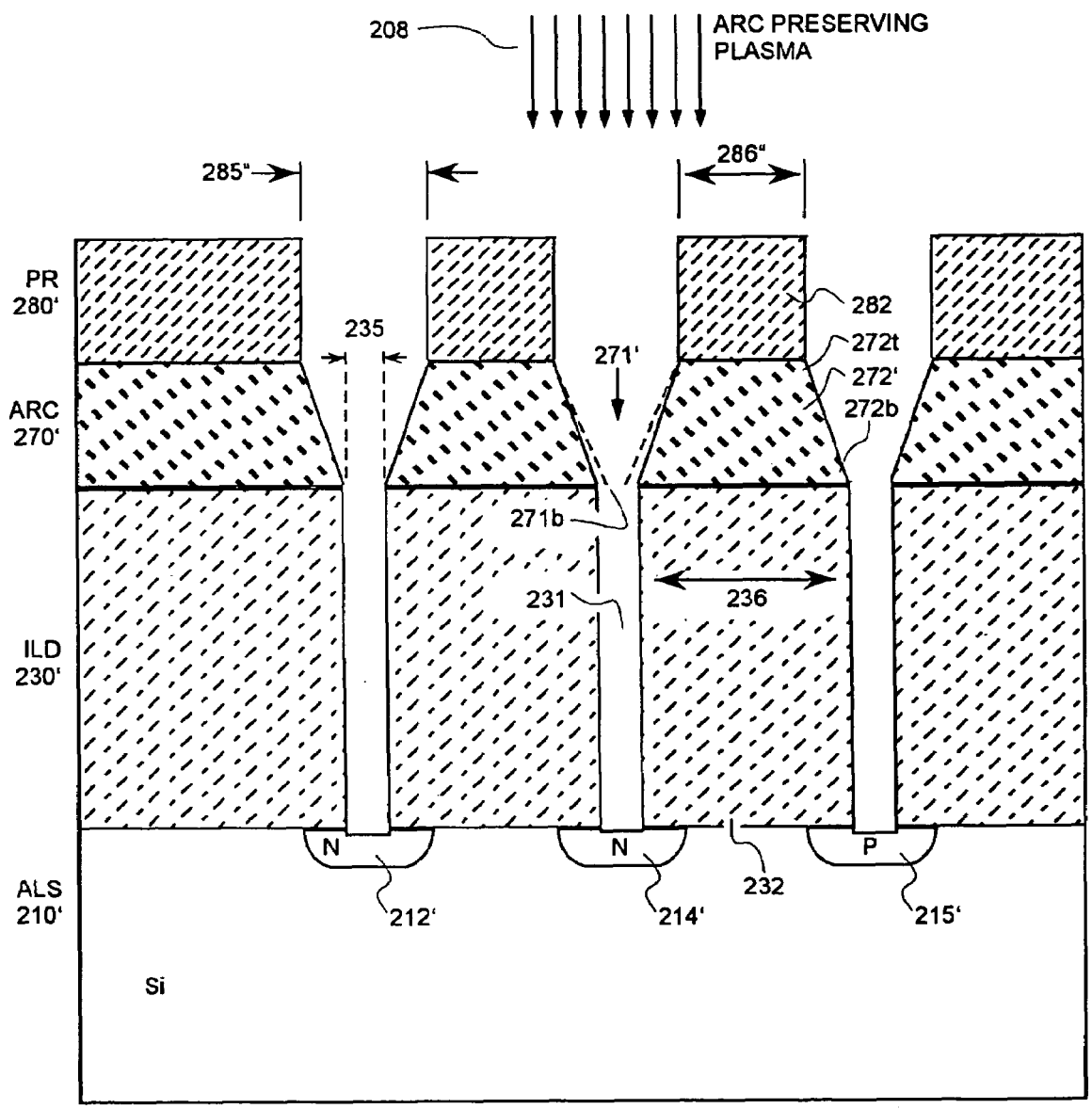

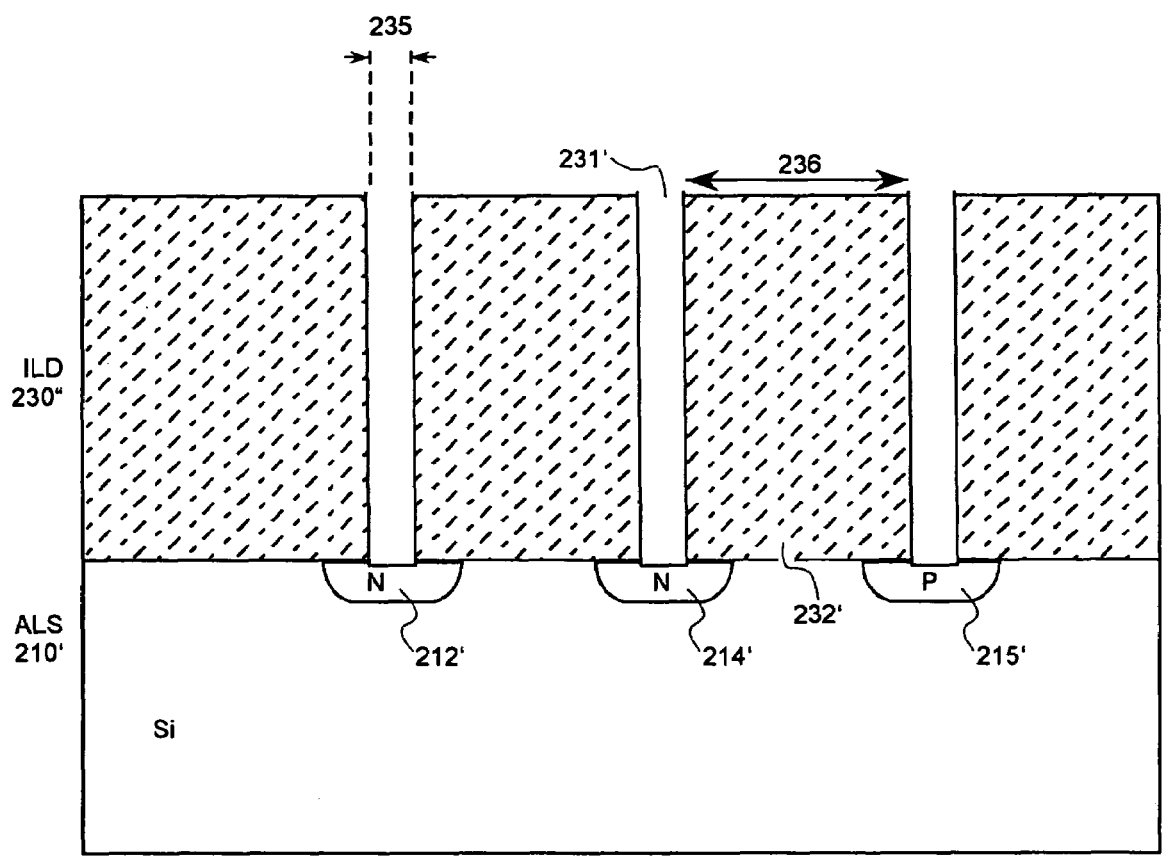

205

VIA FILL

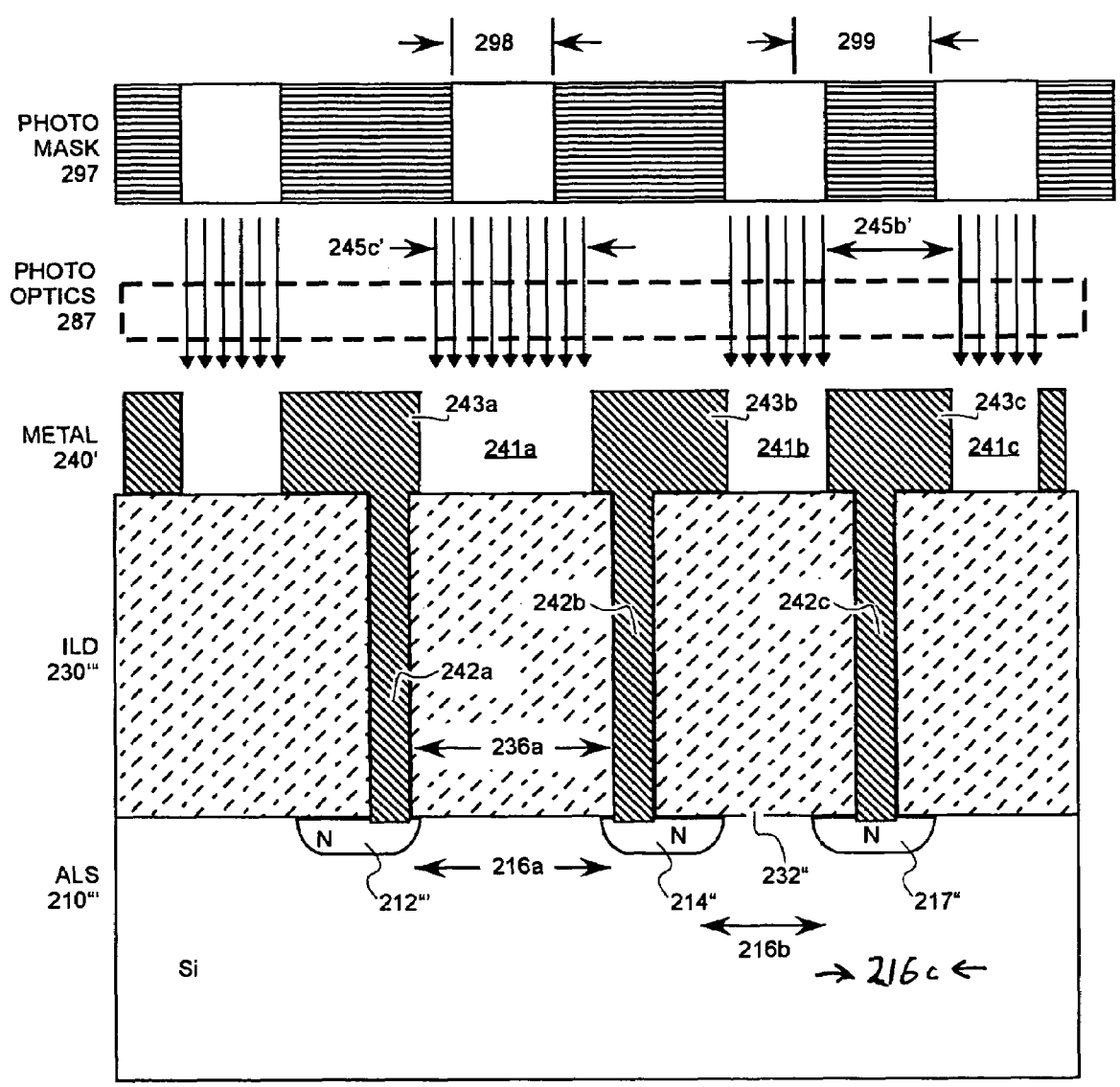

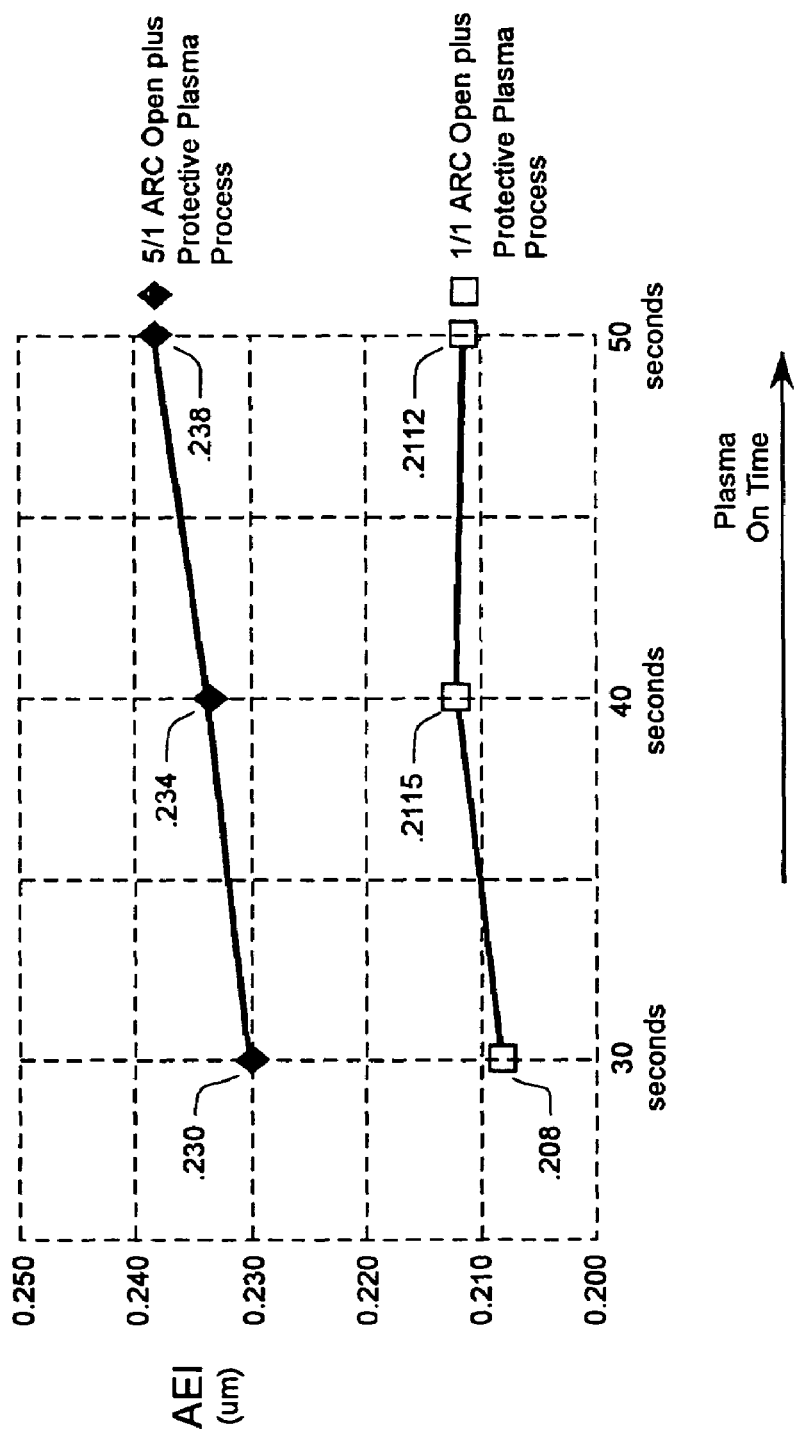

DYNAMICALLY CONTROLLABLE REDUCTION OF VERTICAL CONTACT DIAMETER THROUGH ADJUSTMENT OF ETCH MASK STACK FOR DIELECTRIC ETCH

1. FIELD OF DISCLOSURE

The present disclosure of invention relates generally to fabrication of multilayered semiconductor or other monolithically integrated devices.

The disclosure relates more specifically to lithography driven creation of through-holes (vias) through an interlayer dielectric (ILD) that separates a first major, signal conducting layer (e.g., Metal-1) from an active-components containing layer set of a monolithically integrated device so that signal communication may occur between the first layer and the active-components containing layer set.

2. CROSS REFERENCE TO PATENTS

The disclosures of the following U.S. patents are incorporated herein by reference for purpose of background or otherwise:

(A) U.S. Pat. No. 5,629,237, issued May 13, 1997 to Wang et al. and entitled "Taper Etching Without Re-Entrance Profile";

(B) U.S. Pat. No. 6,329,109 B1, issued Dec. 11, 2001 to Figura et al. and entitled "Mask Having Tapered Profile Used During the Formation of a Semiconductor Device"; and (C) U.S. Pat. No. 6,383,863 B1, issued May 7, 2002 to Chiang al. and entitled "Approach to Integrate Salicide Gate for Embedded DRAM Devices".

3. DESCRIPTION OF RELATED ART

Monolithically integrated devices such as semiconductor integrated circuits typically contain multiple layers of materials, successively disposed one above the other. By way of example, a typical integrated circuit (IC) device may include a monocrystalline silicon substrate on top of which are formed a gate oxide layer, a first polysilicon layer (poly-1), and a next oxide layer, this being followed by alternating further layers of metal or other electrical conductors and oxide or other electrical insulation.

Many of the integrally stacked layers of an IC are specially patterned to contain unique configurations of interconnect, insulation, and/or active components. Often, the so-called, active layers set or lowest set of the patterned layers has the greatest number of, and the most densely packed set of, active component terminals (e.g., transistor gates, drains and sources). (The active layers set or "ALS" typically includes the poly-1 and/or poly-2 layers, the gate oxide layer(s) and the semiconductor epitaxial layer. It may have fewer or more such, densely patterned layers.)

Because there is often a high density of component terminals in the active layers set, and because component terminations in the ALS are often very close to one another (e.g., they are more closely spaced to one another than are comparable terminals in higher layers), device designers usually face more challenging interconnection problems at or near this active layers region than those found in higher and less densely populated layers.

Among the challenges that designers face when interconnecting to, or near the active layers set are those of: (a) how to make effective contact with the active layer set while preventing short circuits from developing between terminal nodes that are intended to be isolated from one another; (b) how to avoid open circuit breaks from occurring among interconnect lines just above the active layer set; (c) how to maintain desired conductivity values (e.g., low resistance) along various interconnect lines and at respective contact points; and (d) how to avoid excessive electrical capacitance from developing between adjacent conductors. When cutting edge technology is being deployed (e.g., where transistor sizes are at or close to leading edge capabilities and switching frequencies are very high), it is often desirable to engage in actual experimentation for determining whether the monolithically integrated device operates as intended rather then merely resorting to computer simulation in order to prove that desired results (e.g., signal switching speeds, interconnect delays) have been achieved. Cost and time limitations are problems however. Lithography masks for the active and near-active layers tend to be relatively expensive and it may take some time to have revised photomasks made and delivered. As a result, designers of the ALS (active) layers and of the first major interconnect layer (metal-1) often shy away from actually experimenting with too many permutations of critically dimensioned aspects such as contact size and inter-contact spacing. This may disadvantageously block them from finding optimal configurations for critically-dimensioned (CD'd) aspects of their designs.

Techniques are disclosed herein for giving designers of the so-called, Metal-1 interconnect layer, and of the insulation layer directly below it (ILD-0/1), more latitude in finding optimal configurations for critically-dimensioned (CD'd) aspects of those layers.

INTRODUCTORY SUMMARY

Structures and methods may be provided in accordance with the present disclosure of invention for improving over the above-described design problems.

More specifically, in accordance with a first aspect of the present disclosure, during test and/or mass-production of integrated device wafers a lithographic photomask is used to project an image of ILD through-holes onto a photoresist (PR) layer disposed above an interlayer dielectric (ILD) of the in-process wafers. An ARC layer (Anti-Reflection Coating layer) is interposed between the PR and the ILD layers. Vertical through-holes are etched through the photoresist layer in accordance with the projected mask image. However, when it comes to continuing the through-holes through the ARC layer, an inwardly-tapering etch process is used. In the inwardly-tapering etch process, an etch recipe that excessively protects ARC sidewall material from being quickly eroded away is used. As a result of the sidewall etch inhibiting mechanism, a centrally-oriented vertical etch rate along a center line of an ARC layer opening (along a vertical line spaced away from sidewalls) substantially exceeds sidewall-adjacent vertical etch rate and a sloped sidewall results. This sloped-sidewall etch mechanism causes the opening dimensions at the bottom of the ARC layer through-holes to be substantially smaller than those at the top of the ARC layer through-holes.

The inwardly-tapered through-holes of the ARC layer are then used for masking, a vertical etch-formation of openings through the ILD layer. As a result, the vertically etched-through openings in the ILD have smaller width dimensions than corresponding dimensions of the lithographic image that had been projected onto the photoresist from the photomask. By adjusting the sidewall-sloping angle of the inwardly-tapering etch process used on the ARC layer, a same lithography mask and same optics settings may be used over and over while creating vertical etch-through openings through the ILD layer of different opening dimensions. Designers can conveniently experiment with different vertical opening dimensions so as to find better permutations of contact width and interconnect pitch.

A further aspect of the disclosure is that a mask-protecting etch recipe is also used for etching through the ILD (interlayer dielectric), where the etch recipe selectively protects the tapered openings in the ARC layer from excessive wearing away.

An in-process wafer in accordance with the present disclosure may comprise: a photoresist layer (PR layer) disposed over an interlayer dielectric (ILD) with an ARC layer interposed between the PR layer and the ILD, where first openings of respective first widths are defined through the PR layer and where, inwardly tapering, second openings are defined through the ARC layer continuing from the first openings of the PR layer and tapering to substantially smaller and respective, second opening widths in the ARC layer. An in-process wafer in accordance with the present disclosure may further comprise: respective and vertical, third openings are defined through the ILD and continuing from the inwardly tapering, second openings of the ARC layer.

A contact forming method in accordance with the present disclosure may comprise: (a) patterning an organic photoresist layer which is provided over an organic ARC layer, where the ARC layer is provided over a dielectric layer, the patterning of the photoresist layer causing through-holes to be defined in the photoresist layer; (b) using an inwardly-tapering etch process to continue the through-holes of the photoresist layer into the ARC layer as inwardly-tapered through-holes of the ARC layer; (c) using an anisotropic etch process to continue the inwardly-tapered through-holes of the ARC layer into the dielectric layer as substantially vertical contact holes through the dielectric layer; and (d) filling the substantially vertical contact holes with an electrical conductor.

Other aspects of the disclosure will become apparent from the below detailed description.

BRIEF DESCRIPTION OF THE DRAWINGS

The below detailed description section makes reference to the accompanying drawings, in which:

FIG. 2C is a third schematic cross sectional view continuing the process of FIG. 2B and showing a state where vertical openings have been formed in the interlayer dielectric material to reach the active layers set (e.g., transistor gate, drain and source electrodes);

FIG. 2D is a fourth schematic cross sectional view continuing the process of FIG. 2C and showing a state where the ARC layer has been removed;

FIG. 2F is a sixth schematic cross sectional view continuing the process of FIG. 2E and showing a state where the metal-1 interconnect layer has been patterned;

FIG. 3C includes a graph showing ARC tapering results as a function of etch time.

DETAILED DESCRIPTION

Figure 1:
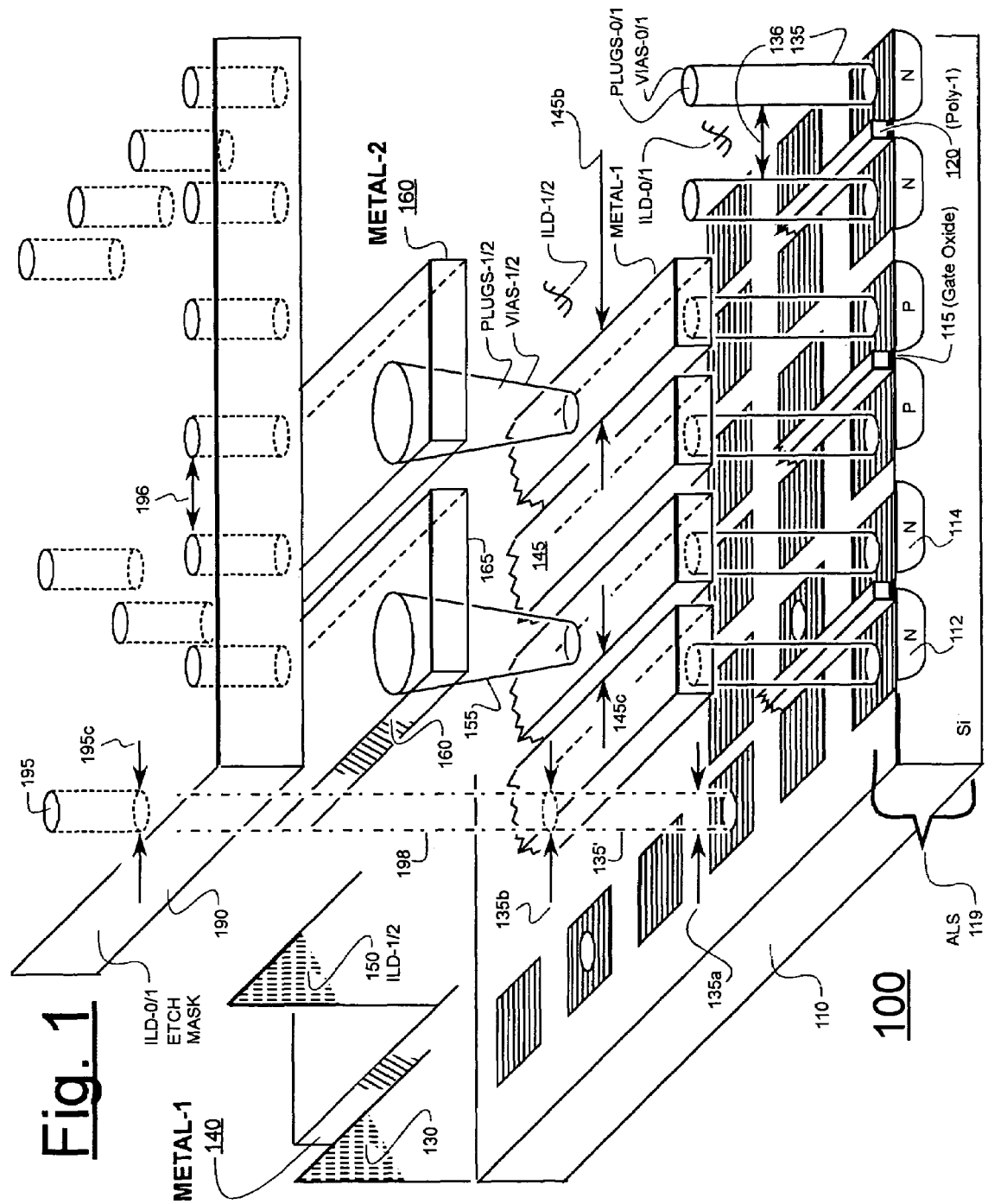
FIG. 1A is a wireframe perspective diagram for introducing issues associated with making contact to the active layers set of an integrated circuit and with forming interconnect lines in the metal-1 layer.

Referring to FIG. 1, a wireframe perspective view (a see-through view) is provided in order to explain a fabrication environment 100 in which through-holes are made through a first interlayer dielectric (ILD-0/1) material layer to provide contact between a set of material layers referred to herein as the active layers set (ALS 119), and a first major interconnect layer (Metal-1 layer 140).

More specifically, in the illustrated fabrication environment 100, a base substrate 110 is provided. The substrate 110 may be composed of monocrystalline silicon or another suitable material (e.g., SiGe) depending on application. A first gate-defining layer 120, such as made of polysilicon or another suitable material is disposed above the substrate 110. A first gate dielectric layer 115, such as made of a thermally-grown silicon oxide or another suitable material is interposed between the substrate 110 and the first gate-defining layer 120. There could be additional gate-defining layers (e.g., poly-2) and further gate dielectric layers. There could be no gate oxide or gate electrode layer if a gateless technology such as bipolar junction transistors is used. For sake of simplicity, a single-gate, horizontal MOS-FET transistor technology is assumed in the illustrated example. Each single gate, horizontal MOS-FET may be comprised of respective source and drain regions, 112 and 114, with a channel provided between. The dimensions of modern transistors tend to be very small. By way of example, channel lengths in the deep submicron range or smaller are currently common. Source, drain, and gate contact areas tend to have proportionally small dimensions. For example, a source contact region may be circular in shape and may have a diameter of 500 nanometers (nm) or less.

A rough definition for the active layers set (ALS 119) has been introduced above. Within the context of the present disclosure, transistor forming layers such as the substrate 110 (or an epitaxially grown surface thereof), the gate dielectric 115 and the gate-electrode 120 defining layers (e.g., poly-1) can be considered part of the active layers set 119. More generally, any set of layers where relatively closely spaced components (e.g., electrical and/or optical) are provided may be considered as part of the active layers set 119. Thus, if FIG. 1 had alternatively shown the presence of a second polysilicon gate layer and a control gate dielectric layer, those too would typically have been considered as part of the active layers set 119.

Those skilled in the art will appreciate that the components of the active layers set 119 are typically the most closely spaced together parts of the monolithically integrated device. The problem is how to operatively couple to the components of the active layers set 119 so that interconnection between the components and/or communication with the components of the active layers set 119 may be made while fabricating in a mass-production environment. The problem is how to do so without running into problems such as undesired shorts or opens. The problem is how to do so while achieving circuit switching speeds and/or signal transmission times within pre-specified tolerance windows. These are significant problems.

The specific example 100 of FIG. 1 includes a first metal layer 140 (Metal-1) that is insulatively supported above the active layers set 119. This Metal-1 layer 140 is to be used for interconnecting different parts (e.g., different transistors) of the active layers set 119 to one another and/or to elements in higher layers (e.g., in the Metal-2 layer, 160). A first interlayer dielectric (ILD) film 130 is provided to separate the densely-populated active layers 119 from the first major interconnect layer (Metal-1, 140). The first major interconnect layer (140) is usually one of the most densely populated and densely patterned of the interconnect layers (140, 160, etc.) in terms of numbers of interconnect lines, in terms of interconnect line widths and in terms of spacing provided between interconnect lines. The need for such dense patterning is understandable given that the first major interconnect layer (140) makes primary contact with the active layers set 119 (the set that is usually most densely populated with active components, e.g., transistors, diodes, etc.). Often, if a connection to a component terminal in the ALS is to be made at all, it will be made by way of a contact extending vertically from the first major interconnect layer (140) to the ALS (119).

Typically, there will be provided above the first major interconnect layer (140) additional layers of alternating insulation (e.g., ILD 150) and conducting material (e.g., Metal-2 160). It is possible for contact holes to be made directly from the Metal-2 layer 160 to the active layers set 119 and for these long-reach holes (not shown) to be filled with metal. This is not typically done. However, to avoid possible confusion, short-reach contact holes; meaning the ones which are designed to extend upwardly from the active layers set 119 (hereafter, also conductive LAYER-0) to make connection with the first major interconnect layer 140 (hereafter, also conductive LAYER-1) will be referenced as "0/1 vias" and their respective, hole-filling and signal-conducting material (e.g., tungsten), if any, will be referenced as "0/1 plugs". Similarly, short-reach contact holes which are designed to reach from conductive LAYER-1 (e.g., Metal-1 layer 140) to make connection with conductive LAYER-2 (e.g., Metal-2 layer 160) will be referenced as "1/2 vias" and their respective, hole-filling and signal-conducting material, if any, will be referenced as "1/2 plugs". A cylindrically-shaped, 0/1 via is shown at 135 in wireframe format and it is understood to be conformably filled with a cylindrically-shaped, 0/1 plug (e.g., a tungsten plug). Similarly, a frusto-conically shaped, 1/2 via is shown at 155 in wireframe format and it is understood to be conformably filled with a frusto-conically shaped, 1/2 plug, where the smaller diameter end of the frusto-cone makes contact with an interconnect line 145 in conductive LAYER-1 (140) and the where the larger diameter end of the frusto-cone makes contact with an interconnect line 165 in conductive LAYER-2 (160).

The insulating material which defines at least part of each major insulating layer (130, 150, etc.) will be similarly referenced. Thus, "ILD 0/1" is the insulating layer material which separates conductive LAYER-0 (the active layers set 119) from conductive LAYER-1 (e.g., the Metal-1 layer 140). Similarly, "ILD 1/2" is the insulating layer material which separates conductive LAYER-1 from conductive LAYER-2, and so forth.

After the active layers set 119 has been defined and the ILD-0/1 material (130, e.g., silicon dioxide) is deposited or otherwise layered on top of set 119, the 0/1 through-holes or vias are formed through the ILD-0/1 film for providing passageways for the so-called, short-reach contact connections between the active layers set 119 and the first major interconnect layer (140, e.g., Metal-1). The locations and diameters (or other cross-sectional dimensions) of these 0/1 vias are usually defined lithographically by a dielectric-etch photomask such as shown at 190. More specifically, the location and on-photomask diameter 195c of a given on-photomask feature 195 will be translated (198) by optical transfer means (e.g., 5:1 reduction optics), and photoresist chemistry effects (e.g., optical proximity effects), and etch chemistry effects, into a corresponding 0/1 via 135' having a first contact diameter 135a at its interface with conductive LAYER-0 and having a second contact diameter 135b at its interface with conductive LAYER-1 (Metal-1). For reasons that will be given shortly, it is desirable for diameters 135a and 135b to be fairly close in size to one another so that the corresponding 0/1 via 135' and its filling 0/1 plug (also denoted as 135') will have a sidewall profile that is essentially vertical (about 90 degrees).

In addition to defining contact via widths (e.g., 135a), the 0/1 dielectric-etch photomask 190 will also define separation distances between such ILD-0/1 elements. One such separation-defining aspect of mask 190 is shown at 196 as the on-mask distance between adjacent ones of the on-photomask, via-defining features (e.g., 195). The on-photomask locations and on-photomask dimensions of such separation distances (e.g., 196) will also be translated by optical transfer means (e.g., 5:1 reduction optics), and photoresist chemistry effects (e.g., optical proximity effects), and etch chemistry effects into corresponding separation distances within the ILD-0/1 region, such as separation 136 shown between the rightmost 0/1 vias.

Certain ones of the on-photomask, and via-defining features (e.g., 195) and certain ones of the on-photomask, and separation-defining distances (e.g., 196) will be designated as having critical dimensions (CD's). The critically dimensioned via-defining features (195) and/or separation-defining distances (196) of the photomask 190 are often associated with counterpart, and in-wafer features which are also deemed as being critically dimensioned because they are most difficult to consistently form on a mass-production basis in the in-process wafers and their proper formation is critical to desired operation of the integrated device. (Substrate 110 is understood to be part of such a wafer. Dimension 135a may be an in-wafer CD and dimension 136 may also be an in-wafer CD.) Consistent mass-production of the in-wafer, CD elements (critically dimensioned features) will often depend on what is done during a subsequent one or more photoresist development processes associated with ILD-0/1 (see briefly, photoresist layer 280 of FIG. 2A). Consistent mass-production of the in-wafer, CD elements will also often depend on what is done during a subsequent one or more dielectric etch processes which etch through the 0/1 ILD, and also on what is done during a subsequent one or more via-filling processes that fill 0/1 vias. The critically dimensioned features of the photomask 190 may alternatively or additionally be defined by what formational challenges these on-photomask features (195 and/or 196) place on a more downstream processes, where the more downstream processes define conductive LAYER-1 (e.g., the Metal-1 layer 140).

Because the critically dimensioned features of the 0/1 etch photomask 190 usually push photomask-making technology close to its available limits, manufacturing and inspection of such a 0/1 etch photomask 190 can be both time-consuming and expensive. If designers of conductive LAYER-1 decide they want to change critically dimensioned line widths 145*b* and/or critically dimensioned line separations 145*c* within the patterned version of conductive LAYER-1 (metal-1 140), it may be very difficult for the designers of the 0/1-etch photomask 190 to provide an accommodatingly revised, 0/1-etch photomask 190' (revised version not shown) for doing so in acceptably short time. Typically there will be optical proximity effects to be considered and corrected (by way of OPC) before a workable substitute photomask can be provided. The present disclosure provides an alternate way in which vertically-profiled 0/1 vias (e.g., 135) can be provided in the ILD-0/1 layer (130) where the widths (e.g., diameters 135*a*, 135*b*) of the 0/1 vias can be changed and/or the separations 136 between such substantially vertically-profiled 0/1 vias can be changed without having to change the 0/1-etch photomask 190 and/or the 0/1 photoresist exposure and photoresist development processes (part of process 198) that rely on that 0/1-etch photomask 190.

The reason why it is desirable to maintain the 0/1 vias and 0/1 plugs 135 with substantially vertical sidewall profiles is fairly straight forward. Any substantial increase of width (e.g., diameter) 135*a* at the conductive LAYER-0 interface can increase alignment problems with underlying LAYER-0 component terminals (e.g., 112, 114, 120). Any substantial increase of width (e.g., diameter) 135*b* at the conductive LAYER-1 interface can increase alignment problems with overlying LAYER-1 interconnect lines 145. The design pressures are such as to keep each of the top contact dimension 135*b* and bottom contact dimension as small as possible without becoming so small that contact is lost or electrical resistance becomes excessive. A cylindrical profile satisfies all these design pressures. Often, the LAYER-1 interconnect lines 145 will have to be packed very tightly together because contact with each respective one of the many underlying component nodes (e.g., 112, 114, 120) has to be made, if at all, by way of an overlying LAYER-1 interconnect line 145. Similar design pressures often do not exist for higher ILD's (e.g., 150) and as such, contact plugs (e.g., 155) in those higher ILD's may be made with substantially tapered profiles as is shown in FIG. 1. The interconnect lines (e.g., 165) in the higher interconnect layers (e.g., Metal-2, 160) tend to be wider than those (e.g., 145) in the first major interconnect layer (Metal-1, 140). A width expanding process may be used for increasing via width in the upward direction. Such width expansion may rely on an etch process that has lateral etch rate anisotropy. The lateral etch undercuts an etch mask and creates the wider contact size near the higher interconnect layer (e.g., Metal-2, 160). Such lateral etching is not practical for the densely patterned, first major interconnect layer (Metal-1, 140).

Figure 2A:
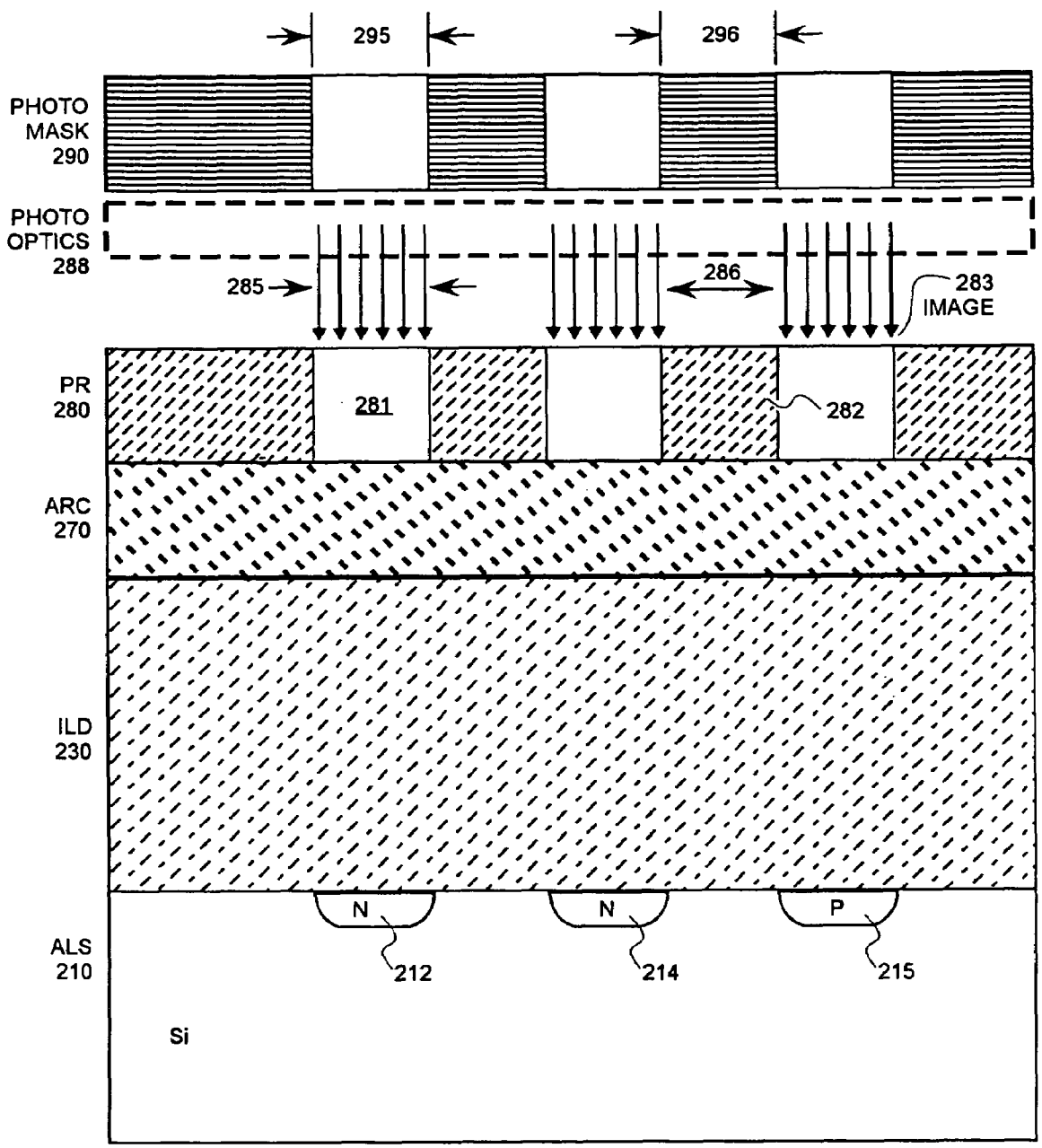
FIG. 2A is a first schematic cross sectional view of an in-process wafer that is being fabricated in accordance with the disclosure and that has a developed photoresist layer at its top.

Referring to FIG. 2A, a first state 201 in accordance with the disclosure is illustrated by way of a cross sectional, schematic view. An active layers set (ALS) is shown at 210. In one embodiment, the ALS 210 includes a monocrystalline semiconductor substrate composed, for example, of silicon. The substrate includes a plurality of doped regions such as N regions 212, 214 and P region 215. The doped regions (e.g., 212, 214, 215) may define termination areas (e.g., ohmic contact regions) for various active components such as transistors, diodes, etc. By way of more specific example, the lateral dimensions of the illustrated termination areas (e.g., 212, 214, 215) can be as small as about 500 nanometers or less. It is desirable in the more specific example to create substantially, vertically-profiled contact vias (0/1 vias) down to these termination areas where a bottom width dimension (135*a*) of the 0/1 vias (not yet shown, see briefly 231 of FIG. 2C) may need to be as small as about 200 nanometers or less.

The illustrated ILD-0/1 layer 230 that is provided above ALS 210 may be composed of a plasma-deposited, inorganic dielectric such as HDP-deposited TEOS (Tetra-Ethyl-Ortho-Silicate) or another such silicon-oxide based insulator. In one set of embodiments, the ILD-0/1 layer 230 has a thickness of about 0.1 μm or more and is composed essentially of CVD silicon dioxide or of spun-on silicon oxide. The inorganic dielectric material of ILD-0/1 layer 230 can be etched by reactive ion plasmas (REI plasmas) which include fluorine containing compounds such as $CF_4$ or $CHF_3$. The dielectric etching plasma may also contain one or more inert bombardment gases such as argon. Alternative or additional inert bombardment gases may be selected from the group including neon, xenon, krypton and nitrogen. (Note nitrogen is not a noble gas, but it may be used in various circumstances as a substantially non-reactive bombardment component, particularly where the layer being bombarded, i.e. the ARC layer, is not going to be retained in the final product, namely the manufactured and monolithically integrated circuit.)

The ILD-0/1 layer is to be lithographically patterned. However, when a photoresist layer such as 280 is exposed to mask-patterned radiation (e.g., UV light), undesired reflections may be produced by reflective surfaces (e.g., silicon) below the photoresist layer. It is therefore common to provide an Anti-Reflection Coating (ARC) layer 270 immediately below the photoresist layer. The ARC layer may be composed of any one of a variety of organic compounds that absorb light at wavelengths such as those used for imaging the overlying photoresist layer 280. In one embodiment, the organic ARC layer 270 typically has a thickness of about 100 Å to 1000 Å or more. In one embodiment, the ARC layer has a thickness of about 700 Å to 800 Å (about 750 Å as an average). The overlying photoresist layer 280 may be composed of a UV-sensitive photoresist material such as UV6 and may have a thickness of about 0.61 μm or less. Both the PR layer 280 and the ARC layer may be stripped away by plasma volatilization after they are no longer useful.

In the illustrated example of FIG. 2A, the photomask 290 has a first feature 295 for photolithographically defining corresponding opening 281 in the PR layer 280. The photomask 290 has a second feature 296 for photolithographically defining a corresponding solid region 282 in the PR layer 280. Appropriate focusing and/or image reduction mechanisms in an optics system 288 are used for projecting a mask image 283 onto the PR layer 280 where the projected image 283 has a width dimension such as 285 for defining respective PR opening 281 and it has a width dimension such as 286 for defining respective solid part 282. In one embodiment, the openings 281 of the post-development photoresist layer 280 have substantially vertical sidewalls with a slope angle in the range of about 87 to 90 degrees.

On first glance, it may appear that dimensions of the projected image 283, such as opening width 285 or solid width 286 can be easily changed simply by changing the magnification power of the optics system 288. This is not correct for several reasons. First, there is the problem of the optical proximity effects that occur during exposure of the photoresist 280. Dimension specific, optical proximity corrections (OPC's) may have been worked into the design of the photomask 290. Therefore, projected image dimensions such as 285 and 286 may not be practically varied merely by changing the magnification or reduction power of the optics system 288. Secondly, the whole of the projected reticle image 283 must fit into a prescribed area and various portions (e.g., 281, 282) of the projected reticle image 283 must align with underlying parts (e.g., 212-215) of the active layers set (ALS) 210. This is yet another fundamental reason why the image reduction factor (e.g., 5:1) of the optics 288 cannot be practically varied after the photomask 290 is made. Nonetheless, a practical method will be disclosed whereby contact widths can be reduced and contact separation distances can be increased without altering the photomask 290 and/or the photoresist exposure and development processes.

Figure 2B:
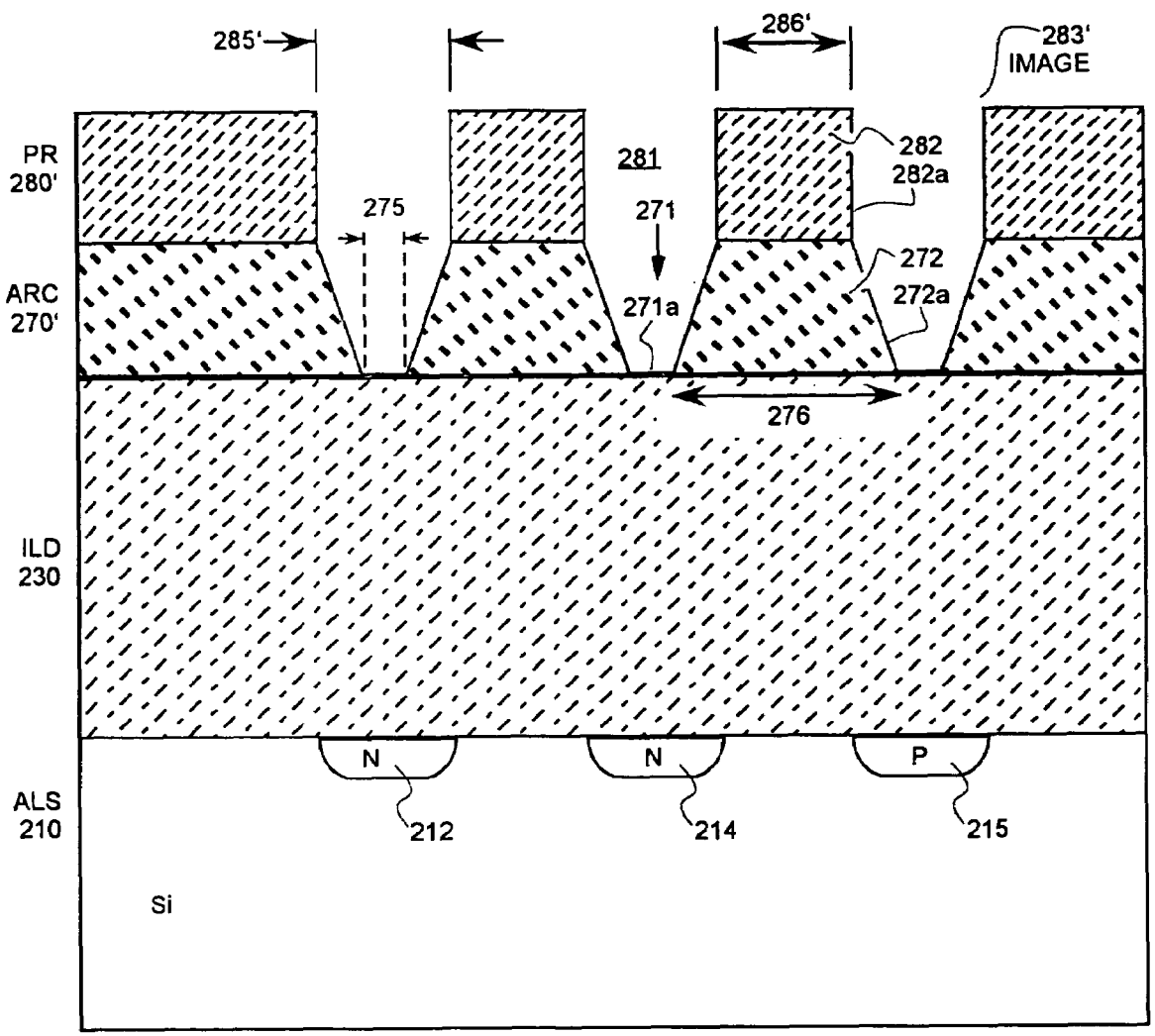
FIG. 2B is a second schematic cross sectional view continuing the process of FIG. 2A and showing a state where inwardly-tapering openings have been formed in the ARC layer.
Figure 4:
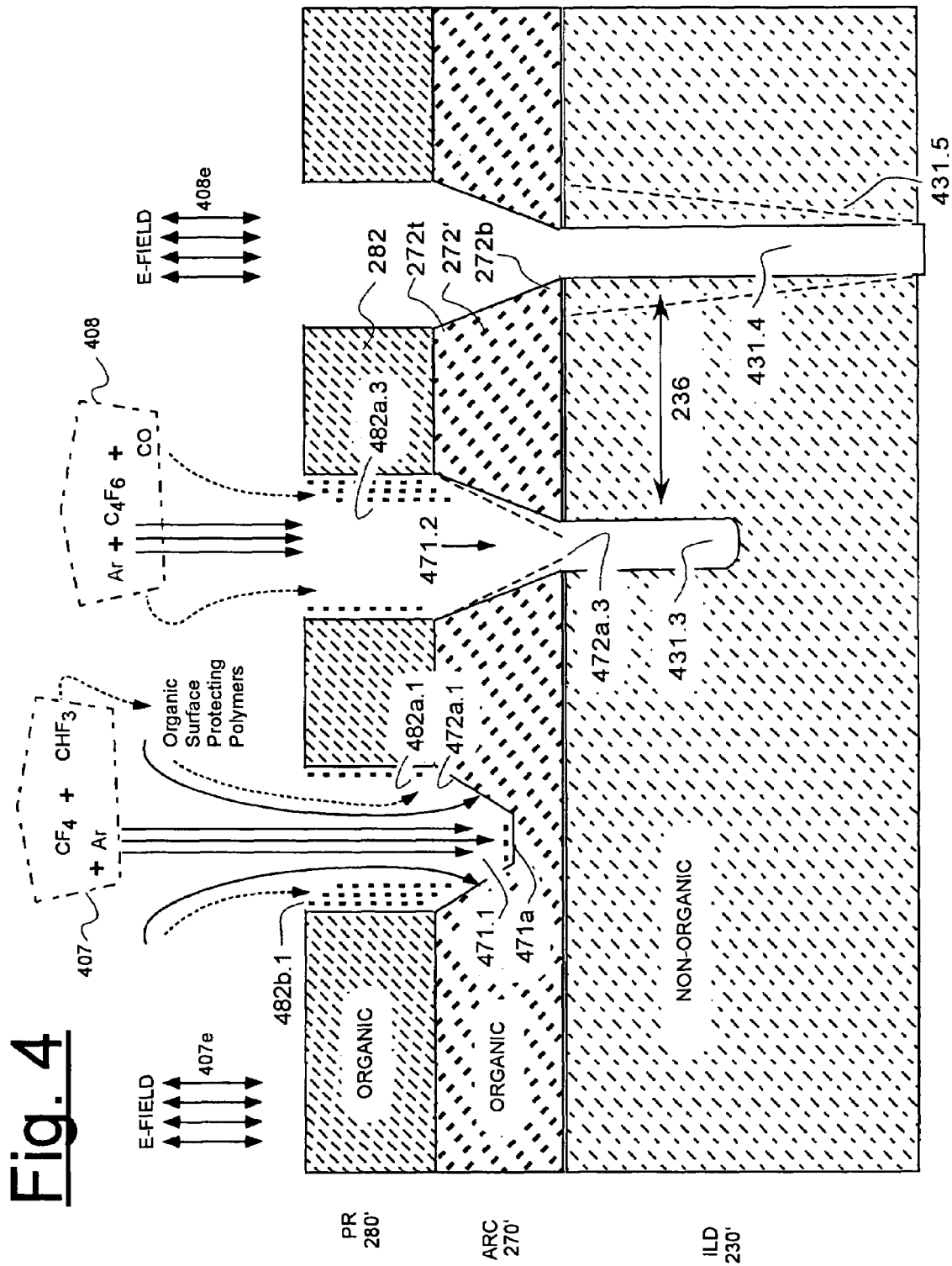
FIG. 4 is a schematic diagram showing some of the mechanisms which may be responsible for creating and maintaining a tapered slope.

Referring to FIG. 2B, a second state 202 in accordance with the disclosure is illustrated by way of a cross sectional view. For each of the through-hole openings 281 made in the post-development PR layer 280', corresponding and inwardly-tapering through-holes 271 are made in the ARC layer 270'. The holes 271 are bounded in the illustration by sloped sidewall surfaces such as 272a and a lateral bottom surface such as 271a. A variety of slope-inducing etch mechanisms may be used for creating the inward tapers of holes 271. Generally these etch mechanisms may be characterized by a relatively low sidewall etch rate and a comparatively high deposition rate for sidewall-etch inhibitors. Examples of sidewall-etch inhibitors include polymeric compounds which tend to cling to organic sidewall material, and build up on the sidewalls, and protect the coated sidewalls against etching. More on this when FIG. 4 is explained.

The slope-inducing etch mechanism(s) used for creating inwardly-tapered openings 271 cause(s) the opening width dimensions 275 at the bottoms 271a of the through-holes 271 to be substantially smaller than those (e.g., 285') at the tops of the respective ARC layer through-holes 271. (The prime {'} in 285' indicates that this dimension may be slightly different from 285 FIG. 2A as a result of the etch used to create holes 271.) One specific example of a sloped-holes creating mechanism is a Reactive Ion Etch (RIE) which uses a plasma containing a combination of $CF_4$ and $CHF_3$ together with an inert bombardment gas such as argon, where $CHF_3$ content is increased above normal. More specifically, the amount of $CHF_3$ is increased to encourage the generation within the RIE plasma (not shown) of sidewall-etch inhibiting, organic polymer material for attaching to the ARC sidewalls 272a of forming holes 271. The etch-inhibiting polymer accumulates more on the earlier-exposed, higher-up sidewall surfaces and thus inhibits their further erosion. In one embodiment, the volumetric flow ratio of $CF_4$ (in sccm) to $CHF_3$ (also measured in sccm) is reduced to substantially less than 5:1 (5-to-one), and more preferably, to less than about 3:1, and yet more preferably, to being at or less than about 1:1.

It is believed that the $CF_4$ component of the plasma produces fluorine radicals which tend to isotropically etch away exposed parts of the organic, ARC material. The $CHF_3$ content in the plasma is believed to produce polymeric organic compounds which attach to and protectively cover the ARC material. Argon ions are believed to be propelled by electric fields to move mostly in the vertical direction to bombard and erode-away etch inhibitors, mostly from the bottom surfaces 271a, thereby allowing fluorine radicals to eat away at those bottom surfaces 271a. An inwardly-growing ring (not shown) of accumulating polymer slowly reduces the surface area at the bottoms 271a which is available for attack by argon and fluorine. Increasing the ratio of $CHF_3$ to $CF_4$ increases the rate at which the protective bottom ring shrinks inwardly along bottom surface 271a.

For one specific etch tool (the Applied Materials eMax™ Centura™ dielectric etch tool) it was observed that a $CF_4/CHF_3$ flow ratio (in sccm/sccm) of about 5:1 should be used if a substantially vertical sidewall profile is desired for the through-holes of the ARC layer 270. However, in accordance with the present disclosure, the $CF_4/CHF_3$ flow ratio is intentionally altered toward being less than about 3:1, and yet more preferably, toward being at or less than about 1:1 so that inhibitor deposition rate on the organic sidewalls 272a (and also on PR sidewalls 282a) is greater and inwardly tapering of the through-holes 271 results as a consequence.

In one embodiment, an ARC etching recipe of 60 sccm $CF_4$, 60 sccm $CHF_3$ and 100 sccm Ar was used in a magnetically-enhanced reactive ion plasma etch tool such as the Applied Materials eMax™ Centura™ dielectric etch tool with a pressure of 100 mT (milliTorr), a power setting of 300 W (Watts) and a magnetic field setting of 30 G (Gauss) to achieve the 1:1 $CF_4/CHF_3$ flow ratio. Observed via width reduction was about 13% (going down from a 0.205 μm average diameter to a 0.178 μm average diameter as further explicated below). In the given case, the thickness of the ARC layer was about 750 Angstroms and the inward slope angle was therefore about 10 degrees off the perpendicular. Greater slopes are achievable. Workable slopes off the perpendicular can be in the range of about 4 to about 40 degrees, or more particularly in the range of about 7 to about 22 degrees. The bottom width dimension 275 is a function of ARC layer thickness as well as inward-taper slope. Accordingly both should be considered in determining how to realize a desired reduction of hole size 275.

It may be understood from FIG. 2B that bottom hole size 275 is not the only dimension which changes as a result of tapered etching. At the same time that the bottom dimension 275 of each inwardly-tapered and respective, ARC opening (e.g., 271) is made substantially smaller (e.g., 13% smaller than the top opening 285'), the bottom dimension 276 of each corresponding and trapezoidally-shaped, solid section (e.g., 272) in the ARC layer is made commensurately larger than the corresponding width dimension 286' of the overlying and respective, PR solid section 282. It will be seen shortly that each such, increased, bottom dimension 276 of the corresponding solid part 272 of the ARC layer can be associated with a respective, plug separation distance. (See briefly 236 of FIG. 2C). It will be seen shortly that each bottom opening dimension 275 of each inwardly-tapered ARC opening 271 can be associated with a respective, plug width dimension. (See briefly, FIG. 2E.)

Referring next to FIG. 2C, a third state 203 in accordance with the disclosure is illustrated by way of a cross sectional view. A selective and primarily vertically directed, dielectric etch process 208 is used to etch substantially vertical through-holes 231 through the ILD 230' while using the inwardly-tapered openings 271 of the ARC layer 270 (FIG. 2B) as masking means for defining the width dimensions 235 of the dielectric through-holes 231. During the etching of the material of ILD 230 (FIG. 2B, e.g., $SiO_2$), some erosion may take place in the overlying ARC material 270'. Therefore the end state 271' of the ARC openings may be slightly wider than what was originally present when the dielectric etch process 208 began. Dashed lines 271*b* indicate a possible "before" profile of the ARC openings 271. As can be seen, the bottom corners 272*b* of the ARC solid regions 272' may be slightly eroded away, more so than the top corners 272*t* of such solid regions 272'. This is because the bottom ARC corners 272*b* are not protected by the overlying solid material 282 of the PR layer 280' as are the top corners 272*t*.

In order to prevent excessive erosion of the exposed bottom corners 271*b* of the ARC solid regions 272', a substantially carbonaceous, etch recipe may be used for protectively covering the organic surface material of the bottom ARC corners 272*b*. Selective adhesion of such a carbonaceous coating to the exposed ARC surfaces 272' can help to minimize their erosion during the creation of vertical through-holes 231 in the ILD. More specifically, in one embodiment, the dielectric etch process 208 comprises the use of a 40 sccm flow of $C_4F_6$, 25 sccm of $O_2$, 250 sccm of CO and 350 sccm of Ar in an Applied Materials eMax™ Centura™ dielectric etch tool with a pressure setting of 30 mT (milliTorr), a power setting of 1000 W (Watts) and a magnetic field setting of 50 G (Gauss) for 280 seconds to achieve the substantially vertical etch-through of vias 231 through an ILD 230' having a thickness of about 0.1 um or more. The inclusion of the significant carbon monoxide content (e.g., 250 standard cubic centimeters per minute of CO) into the plasma mix is believed to generate a carbonaceous coating material which preferentially adheres to the organic surface material of the ARC surfaces, including to corners 272*b*, but not so much to the inorganic material of the ILD material 230'. This preferential adherence is believed to cause the carbonaceous dielectric etch process 208 to be selective for vertical removal of the ILD material 230' as opposed to removal of the ARC material at bottom ARC corners 272*b*. As a result, much of the bottom corner material 272*b* of the taper-etched ARC layer (270 of FIG. 2B) is preserved and a substantial reduction in contact width size (235 as opposed to 285") is therefore realized.

A previous etch recipe for creating through-holes through the ILD layer 230 was constituted by a 15 sccm flow of $C_4F_6$, 10 sccm of $O_2$, 0 sccm of CO and 350 sccm of Ar in an Applied Materials eMax™ Centura™ dielectric etch tool with a pressure of 30 mT (milliTorr), a power setting of 1600 W (Watts) and a magnetic field setting of 50 G (Gauss) for 160 seconds to achieve the substantially vertical etch-through of vias through the same thickness of dielectric material. If this previous etch recipe is compared against the newer, carbon-monoxide containing recipe (above), it can be seen that the newer etch recipe is characterized by a longer etch time, a lower power setting, substantially increased flow rates for the $C_4F_6$ and $O_2$ input gases, and of course, the addition of the carbon monoxide input gas. Other alternatives may be used for providing the ARC-protecting, carbonaceous coating material of the newer etch recipe. In place of, or in addition to the carbon monoxide (CO) input gas, $CO_2$ for example, may be used as a carbon source.

Referring to FIG. 2D, a fourth state 204 in accordance with the disclosure is illustrated by way of a cross sectional view. The photoresist layer 280' and ARC layer 270' of FIG. 2C have been stripped away by plasma ashing or other appropriate means. ILD layer 230" is left behind with substantially vertical, contact vias 231' (e.g., with sidewalls of about 0 to 2 degrees slant off the perfect perpendicular) extending through to respective active layers set, contact regions such as 212', 214' and 215'. (For purpose of safety margin, the vias cut slightly into the ALS contact regions 212', 214', 215' etc.) The formed vias 231' have corresponding via widths 235 that have been derived from the inwardly-tapered openings 271' of the ARC layer of FIG. 2C. Spacings 236 between the formed vias 231' have corresponding dimensions that are also attributed to the bottom dimensions of the inwardly-tapered openings 271' of the ARC layer of FIG. 2C.

Figure 2E:
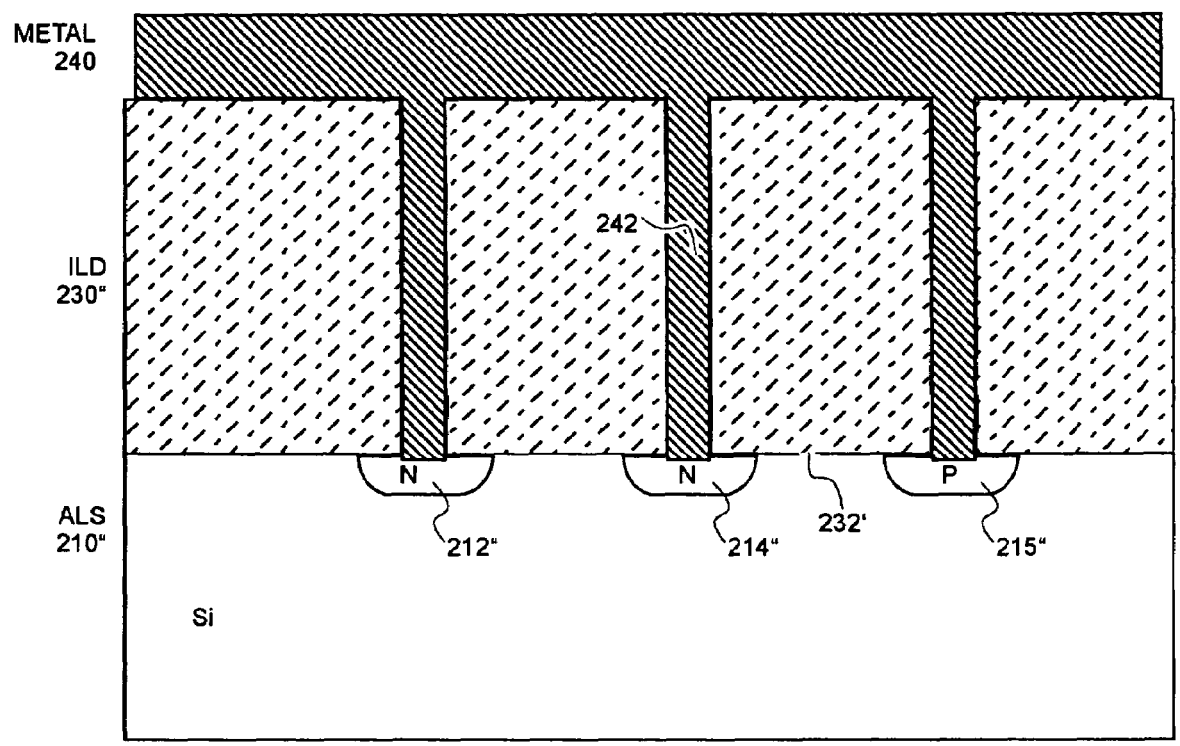
FIG. 2E is a fifth schematic cross sectional view continuing the process of FIG. 2D and showing a state where the vertical vias in the interlayer dielectric have been filled with metal.

Referring to FIG. 2E, a fifth state 205 in accordance with the disclosure is illustrated by way of a cross sectional view. A filling metal material 240 such as tungsten (W) is sputter deposited or otherwise provided to fill the open vias 231' of FIG. 2D and to cover the tops of the solid ILD islands (e.g., of dimensions 236 in FIG. 2D). Element 242 is a metal plug that conformably fills via 231' (FIG. 2D) and makes operative contact with active region 214" (e.g., an N+ doped, ohmic contact region). In one embodiment, additional barrier metal films may be pre-deposited on top of the ILD mesas, such as made of TiN.

Referring to FIG. 2F, a sixth state 206 in accordance with the disclosure is illustrated by way of a cross sectional view. A new photomask 297 is used to project a further lithographic image through optics system 287 onto a photoresist layer (not shown) that was earlier deposited on metal layer 240 of FIG. 2E. That PR layer (not shown) would have been developed and used for etching new openings such as 241*a*-241*c* in the illustrated metal layer 240' of FIG. 2F. The metal layer openings 241 have respective opening dimensions such as 245*c* of opening 241*a*, where the latter opening dimensions correspond to features 298 of the new photomask 297. Additionally, interconnect lines such as metal island 243*c* (shown in cross section) are defined to have respective line-width dimensions such as represented by 245*b*'. The line-width dimensions 245*b* correspond to features 299 of the new photomask 297. Given that the widths of corresponding contact plugs 242*a*-242*c* are defined by the tapered ARC openings 271 of FIG. 2B and by the separations 236 between the contact plugs, it may be seen that the interconnect combination of plugs 242 and lines 243 in FIG. 2F has been partially defined by the tapered ARC openings 271 of FIG. 2B.

More specifically, for the illustrated example of interconnect lines 243*a*-243*b* (associated with respective plugs 242*a* and 242*b*), a greater, lines-separation distance 245*c* has been realized due to the increased separation distance 236*a* between contact plugs 242*a* and 242*b*. Alternatively or additionally, in the ALS 210''', a greater, terminal-separation distance 216*a* has been realized between component contact regions 212''' and 214''' due to the increased separation distance 236*a* realized between contact plugs 242*a* and 242*b*. The ability to increase contact separation distance 236*a* (through the inwardly-tapering process of FIGS. 2B-2C) gives design engineers some degrees of flexibility in determining where to place metal interconnect lines such as 243*a*-243*b* and/or in determining where to place ALS contact regions such as 212''' and 214'''. Such flexibility would not have been otherwise present if the flexible, ARC-hole tapering process (FIGS. 2B-2C) were not available.

Alternatively or additionally in FIG. 2F, a shrunken (216*c*) and/or positionally shifted (216*b*) contact region 217" may be included in the design of the active layers set (ALS) 210''' due to the ability to reduce contact plug width dimensions 235 (not explicitly shown, see instead FIG. 2D). Such small changes in critically dimensioned separation distances (e.g., 236*a*, 245*c*, 216*a*) and/or component contact widths (216*c*) or placements can have significant impact on device performance. Those skilled in the art will appreciate that switching speeds in the active layers set 210' and/or signal propagating characteristics of the interconnect (e.g., the patterned metal layer 240') can be fine tuned by altering a number of parameters including separation distances such as 236a, 245c, and/or 216c. The other factors which may come into play in determining device performance include, but are not limited to, doping profiles in the ALS 210', the composition of the metal used for defining plugs 242 and the rest of layer 240', the composition of the dielectric used for defining layer 230" (e.g., low-K or high-K), and the line widths 245b of the interconnect lines 243 in layer 240'. Signal propagation characteristics of the fabricated device may also depend on the respective widths of metal plugs 242 since the RC contributions of these can play a role in determining device performance. Plug widths (see briefly 235 of FIG. 2D) can affect more than just the RLC transmission line characteristics of the Metal-1 interconnect. They can also affect mass-production yield because they may determine how closely the Metal-1 photomask 297 has to be aligned with ALS features (e.g., 212", 214", 217", etc.) in order to provide for consistent and reliable mass production of monolithically integrated device such as that shown being produced in FIG. 2F.

As already explained above, device performance cannot always be precisely predicted with computer analysis tools. Situations may arise where the designers of the Metal-1 photomask 297 or of the ALS photomasks (not shown) wish to slightly change the patterning of their respective layers 240' and 210'''. They may want to do so without forcing designers of the ILD layer 230''' to order a new via photomask 290 (FIG. 2A). In accordance with the present disclosure, some of these changes may be realized using the chemically-tailorable process of FIGS. 2B-2C without having to order a new via photomask 290. Accordingly, designers can more readily experiment, in the physically realized sense, with changing plug widths (e.g., 235) and/or plug separations distances (e.g., 236a) and/or other parameters (e.g., line spacing 245c') of critically dimensioned parts in order to see how such changes may affect device performance and/or mass-reproducibility and reliability. The present disclosure therefore contemplates the use of ARC tapering to different plug widths and/or plug-separation distances so that comparative wafer samples can be generated by use of variable tapering and the produced wafers can then be physically tested and the test results compared to see which of different contact plug widths (235) and/or separation distances (e.g., 216a) provides the best of desired wafer characteristics (e.g., high switching speed, low power consumption, high mass production yield, good reliability, etc.).

Figure 3A:
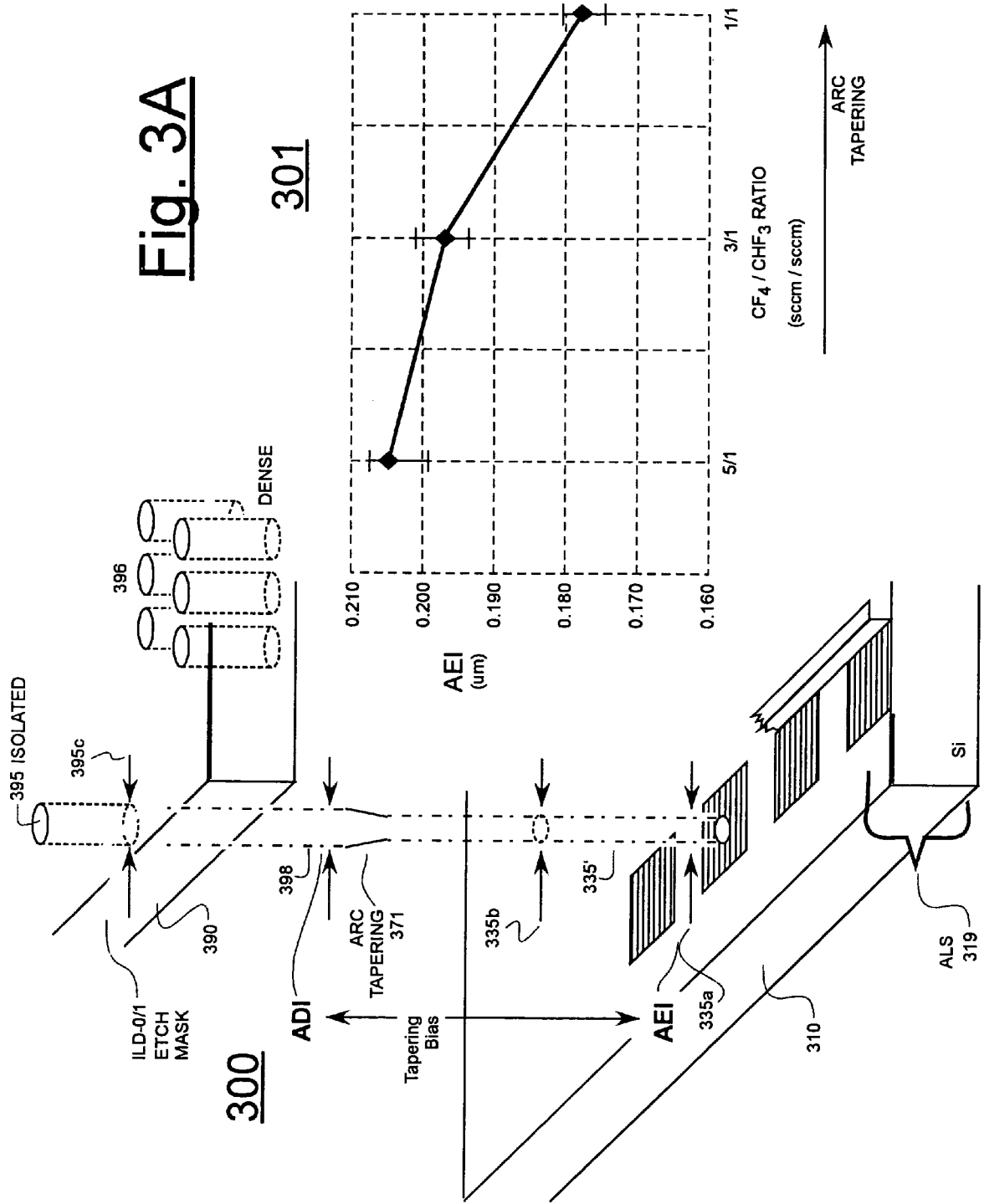
FIG. 3A includes a graph showing experimental results following use of different ARC tapering recipes.

FIG. 3A includes a first graph 301 which shows some experimental results that have been obtained from use of different ARC tapering recipes. The graph suggests that a good range of fine tunability is available for defining average opening size (bottom diameter 335a) of the ILD-0/1 vias (335'), and distinct min/max ranges for mass production of wafers with such ARC-controlled ILD-0/1 vias. The experimental results are given in more detail in below Table 1A. FIG. 3A shows only average and min/max results for so-called star measurement points (MP's). Yet other details from the same experiments are given in Table 1B.

Three sample wafers were used for each given flow ratio of $CF_4$ versus $CHF_3$, namely, three for the 5:1 ratio, three for the 3:1 ratio, and three for the 1:1 ratio. The sample wafers were all made with a same photomask 390 and photoresist development process 398 The photomask 390 included feature areas defining relatively sparse via populations (relatively "isolated" vias) such as the one represented at 395. The photomask 390 also included yet other feature areas with relatively dense populations of via features (for defining vias that are to be closely spaced apart e.g., about 2000 nm or less from each other on the corresponding wafer). such a "dense" population is schematically represented at 396. Total gas flow rate and chamber pressures were kept crudely constant across the experiment. The experiment used approximately 100 sccm of Ar as the inert bombardment gas. Chamber pressure was set around 100 mT-150 mT, RF power was set at 300 W and magnetic filed was set at 30 G. Run time was about 20-60 seconds. Five sample measurement points were used in a star pattern on each of the nine wafers after via formation in the ILD and after ARC stripping (see FIG. 2D). A scanning electron microscope (SEM) was used to measure via diameters at the bottoms (335a) of a respective 5 sample measurement points on each wafer. SEM observations were also made immediately after photoresist development (ADI is After Development Inspection) but before ARC and ILD etchings. "After Etch Inspection" (AIE) refers to the SEM measurements made after the ARC and ILD etchings but without metal plug fill. The "Bias" column of Table 1 B refers to AEI minus ADI. In other words, it looks for how much wider the post-etch vias were as compared to the substantially non-tapered PR openings (not shown, see briefly 281 of FIG. 2A). Besides the 5-star measurement points (MP's), additional measurements were taken separately for "Densely-packed" vias and for vias that were relatively Isolated (not Densely-packed). Average values and range between minimums and maximums were then calculated as shown in Tables 1A-1B.

It may be seen from Tables 1A-1B and graph 301 (FIG. 3A) that the $CH_4$ versus $CHF_3$ flow ratio defines a tunable parameter which may be used to control the resultant via diameters. Table 1B indicates that the process tends to create the narrower vias where they are usually most needed, in the more densely-packed contact areas of the wafers. (In Table 1B, wafer recipe #8, some of the densely-packed vias did open fully to the slated width all the way down to the contact depth. Thus the 0.124 µm result is starred (**) as being a not wholly reliable number. The width was observed, but it was not always a complete opening all the way through to the bottom of the ILD through-hole.)

TABLE 1A

| Recipe # | Process Condition CF4/CHF3 | Measurement Points | | | | | CD Average | CD Average (um) | Range (um) |
|---|---|---|---|---|---|---|---|---|---|
| | | MP1 | MP2 | MP3 | MP4 | MP5 | | | |
| 1 | 5:1 | 0.203 | 0.212 | 0.215 | 0.205 | 0.207 | 0.208 | 0.205 | 0.026 |
| 2 | | 0.213 | 0.189 | 0.210 | 0.189 | 0.195 | 0.199 | | |
| 3 | | 0.211 | 0.202 | 0.203 | 0.215 | 0.207 | 0.208 | | |
| 4 | 3:1 | 0.205 | 0.192 | 0.198 | 0.197 | 0.189 | 0.196 | 0.197 | 0.022 |
| 5 | | 0.199 | 0.210 | 0.193 | 0.202 | 0.201 | 0.201 | | |

TABLE 1A-continued

| Recipe # | Process Condition CF4/CHF3 | Measurement Points | | | | | CD Average | CD Average (um) | Range (um) |
|---|---|---|---|---|---|---|---|---|---|
| | | MP1 | MP2 | MP3 | MP4 | MP5 | | | |
| 6 | | 0.192 | 0.204 | 0.188 | 0.199 | 0.190 | 0.194 | | |
| 7 | 1:1 | 0.182 | 0.183 | 0.179 | 0.182 | 0.175 | 0.180 | 0.178 | 0.016 |
| 8 | | 0.182 | 0.171 | 0.176 | 0.175 | 0.167 | 0.174 | | |
| 9 | | 0.180 | 0.182 | 0.177 | 0.183 | 0.182 | 0.181 | | |

TABLE 1B

| Recipe # | Process CF4/CHF3 | CHF3/Ar | Press (mT) | CD Averages (μm) | | | | |
|---|---|---|---|---|---|---|---|---|
| | | | | MP's | Dense | Iso | CD Range | Bias Range |
| 1 | 5:1 | 2:1 | 100 | 0.208 | 0.199 | 0.176 | 0.047 | 0.100 |
| 2 | 5:1 | 2:1 | 150 | 0.199 | 0.170 | 0.210 | 0.054 | 0.051 |
| 3 | 5:1 | 4:1 | 100 | 0.208 | 0.170 | 0.213 | 0.050 | 0.028 |
| 4 | 3:1 | 2:1 | 100 | 0.196 | 0.171 | 0.187 | 0.043 | 0.060 |
| 5 | 3:1 | 2:1 | 150 | 0.201 | 0.165 | 0.190 | 0.046 | 0.034 |
| 6 | 3:1 | 4:1 | 100 | 0.194 | 0.137 | 0.182 | 0.069 | 0.014 |
| 7 | 1:1 | 2:1 | 100 | 0.180 | 0.130 | 0.167 | 0.070 | 0.052 |
| 8 | 1:1 | 2:1 | 150 | 0.174 | 0.124** | 0.191 | 0.076 | 0.047 |
| 9 | 1:1 | 4:1 | 100 | 0.181 | 0.131 | 0.164 | 0.053 | 0.036 |
| ADI | | | | 0.209 | 0.147 | 0.192 | 0.077 | 0 |

The common photomask 390 and photoresist development process 398 were originally designed for generating cylindrical vias in the ILD layer of diameters of about 0.200 μm each. Plot 301 of FIG. 3A shows that the 5:1 ARC opening recipe generated ILD vias in the diameter range of about 0.199 to 0.208 μm. There was mostly a positive bias (AEI-ADI) towards enlarging the width of the actual vias as compared to the widths of the ARC openings. As the CF4/CHF3 ratio was reduced from 5:1 to 1:1, the observed AEI opening sizes shrank accordingly. This demonstrates that via width can be reduced by process parameters, with some independence from features originally defined by the via photomask 390 and photoresist development process 398. There appears to be a proximity effect for densely-packed vias. Via width appears to decrease with higher packing density as is indicated in Table 1B. This can be due to optical proximity effects during photolithographic patterning as well as to enhanced density of etch-inhibiting organic compounds during etching of the ARC layer.

Figure 3B:
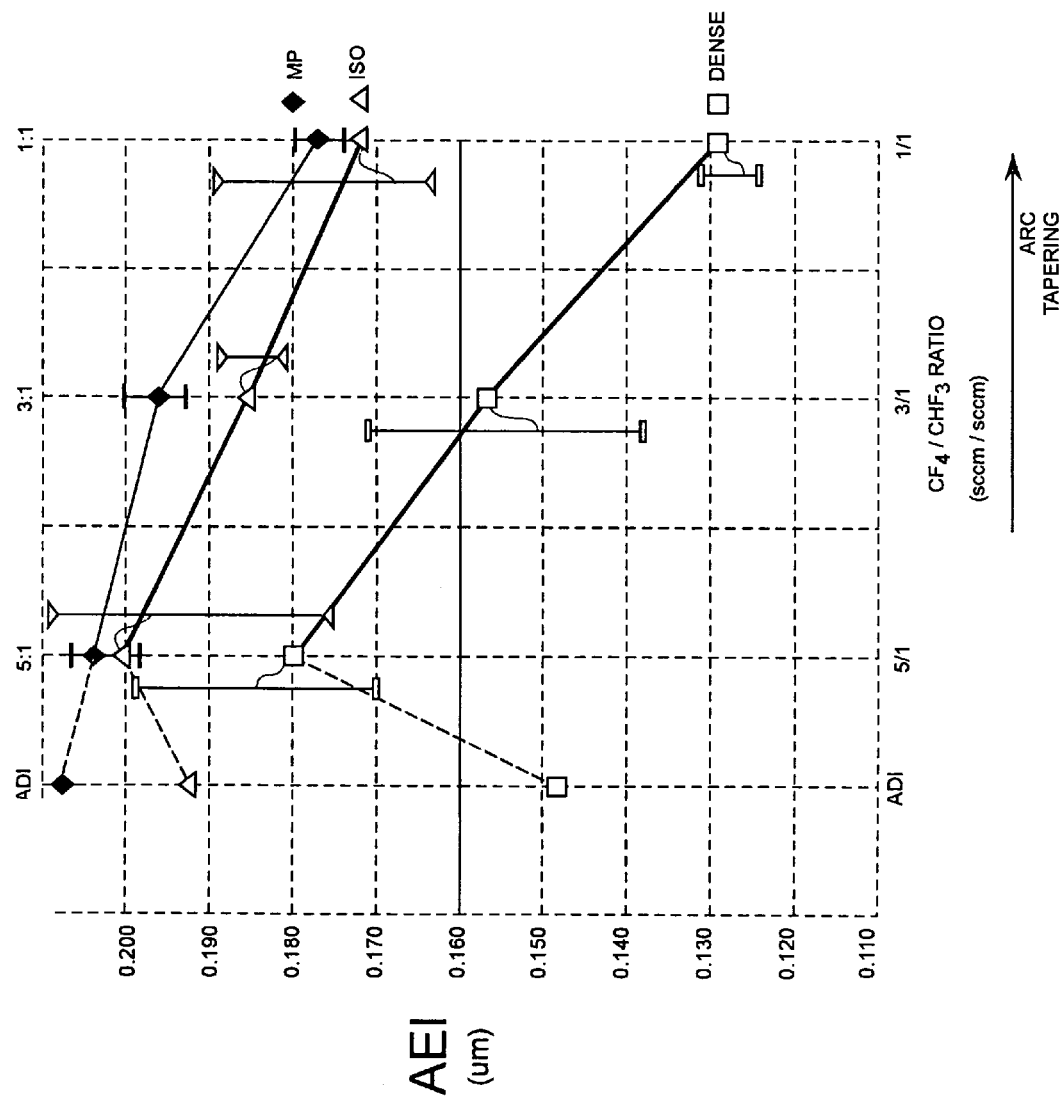
FIG. 3B includes a graph showing different ARC tapering results for densely-packed and relatively isolated ARC openings.

FIG. 3B provides a second graph 302 which shows further aspects of the experimental results. The diamond-shaped plot points and flat line range limiters respectively indicate the average and min/max values for the star-pattern measurement points (MP's) across each of the wafers, both before ARC etching (ADI measurements) and then at the 5:1, 3:1 and 1:1 flow ratios. The triangle-shaped plot points and triangle-shaped range limiters respectively indicate the average and min/max values for the isolated vias. The square-shaped plot points and rectangle-shaped range limiters respectively indicate the average and min/max values for the densely packed vias. It can be readily seen that the densely packed vias responded most aggressively to reduction of the $CF_4/CHF_3$ ratio. The 5:1 $CF_4/CHF_3$ experiments did not incorporate as much ARC-preserving character in the ILD etching for generating the ILD through-holes 231 while the 3:1 and 1:1 experiments used more of the ARC-preserving, ILD etch (process 208). This may explain the positive jump in aperture size from ADI results to the 5:1 AEI results. It may be seen that the 1:1 experiments all showed AEI widths smaller than the original ADI widths.

FIG. 3C provides a third graph 303 which shows results of further experiments. Here, the time for the ARC opening etch (FIG. 2B) was varied over the range 30 seconds to 50 seconds. The ILD etch-through process was the same for both the 5:1 results and the 1:1 results. In each case the ILD etch-through process used the ARC-preserving, ILD etching process 208 of FIG. 2C for generating the ILD through-holes 231. The 1:1 results show good nonvariability to etch time in the range 40-50 seconds. In other words, etch time for ARC opening will not be a critical parameter for determining via width when the 1:1 $CF_4/CHF_3$ flow ratio (or thereabouts) is used.

FIG. 4 provides a schematic explanation for possible mechanisms which can help create and maintain the inwardly-tapered ARC openings. The illustrated openings 471.1, 471.2, 431.3 and 431.4 appear in time staggered order (left to right) rather than all being present in their illustrated states at the same time. In other words, when the first, partially-formed ARC opening 471.1 is present, the completed ARC opening 471.2 is not yet present in its completed state and neither are the partially-formed ILD opening 431.3 and completed ILD opening 431.4 present in their illustrated states. Each comes into being, as illustrated, in a respective one of successive time periods.

Referring first to the partially-formed ARC opening 471.1, the corresponding, tapering plasma 407 is generated in the presence of a vertically-oriented and corresponding electric field 407e. The components of plasma 407 include an etch-inhibitor generating agent such as $CHF_3$. This etch-inhibitor generating agent produces organic polymer components for sticking to organic surfaces such as sidewalls 472a.1 and 482a.1. The vertically-oriented electric field 407e propels non-reactive ions such as argon (Ar) and chemically reactive ions such as fluorine radicals (F)

towards lateral surface 471a. There, the organic polymer etch-inhibitors are removed at a rate faster than their deposition rate. The argon ions (Ar) and fluorine radicals (F, generated from $CF_4$ and $CHF_3$) easily penetrate to vertically remove material from most of lateral surface 471a. The exception is at the outer edges of lateral surface 471a where organic polymer etch-inhibitors are accumulating faster than their removal rate. The accumulating process may be understood to begin on vertical sidewall 482a.1 of the photoresist layer. Ar ions are blocked from reaching the bottom-more of the etch-inhibitors 482b.1 because they strike higher ones on the vertical sidewalls. The accumulating etch-inhibitors 482b.1 define a protective shroud that further extends over the outer edges of lateral surface 471a. This starts the inwardly-tapering etch process going. The taper slope is often a function of electric field strength and mixture ration of $CF_4$ to $CHF_3$ and also of Ar to $CHF_3$.

Referring next to the partially-formed ILD opening 431.3 below the essentially-fully-opened ARC opening 471.2, it is to be understood that the corresponding, vertical plasma 408 is generated in the presence of a vertically-oriented and corresponding electric field 408e. The components of plasma 408 include an etch-inhibitor generating agent such as CO. This etch-inhibitor generating agent produces organic polymer components for sticking to organic surfaces such as sidewalls 482a.3 of the photoresist and/or to sidewalls 472a.3 of the inwardly-tapered through-holes of the ARC layer. The vertically-oriented electric field 408e propels non-reactive ions such as argon (Ar) and chemically reactive ions such as fluorine radicals (F) towards the essentially lateral surface at the bottom of growing well 431.3. There are essentially no organic etch-inhibitors attaching at this bottom surface because it is made of non-organic ILD material. The ILD material is therefore removed independently of deposition rate for etch-inhibitors attaching to organic surfaces such as sidewalls 482a.3 (providing sidewall 482a.3 does not close in on itself). Deposition rate for the organic sidewalls (e.g., 482a.3) is preferably controlled to roughly equalize with removal rate so that the inwardly-tapered ARC sidewall, 472a.3 does not close in on itself. Although the quantity of etch-inhibitor needed for causing the PR sidewall 482a.3 to begin closing in on itself was not experimentally verified, it is reasonably surmised that addition of $CHF_3$ to the second plasma 408 (shifting the carbon to fluorine mix ratio) could cause the developing ILD via 431.3 to begin tapering inwardly as PR sidewall 482a.3 begins closing in on itself. However, as explained above, inward-tapering of the ILD-0/1 vias (431.4) is often undesirable. Nonetheless, it is within the contemplation of the present disclosure that in some cases such inward-tapering of the ILD-0/1 vias (431.4) may be realized through the use of additional carbon content during the ILD via etch where the generated organic material sticks to the sidewalls of the ARC and/or photoresist layers.

Alternatively or additionally, isotropic etching of the ILD-0/1 material may be carried out after the inwardly-tapered ARC openings 471.2 are formed. Such isotropic formation of the ILD-0/1 vias is schematically represented by dashed lines 431.5. The result is different from that of performing an isotropic ILD etch after formation of vertical ARC openings because the starting width for the inwardly-tapered ARC openings 471.2 is smaller. Therefore, the resulting top and bottom widths of the isotropically-etched ILD-0/1 vias (431.5) can be made smaller than what would have occurred had ARC openings with substantially vertical sidewalls been used. Alternatively or additionally, formation of the ILD-0/1 vias may be performed with a combination of the vertical profile plasma 408 being used for part of the formation of the vias and an isotropic etch recipe being used for another part of the formation of the ILD-0/1 vias.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of an example, inward-tapering may be carried out within other kinds of layers besides an organic ARC layer. More specifically, so-called hardmaks composed of $Si_3N_4$ or SiON are sometimes provided below the patterned photoresist layer. An etching chemistry that uses etch inhibitors for maintaining vertical sidewall profile, such as a reactive ion plasma containing HBr and $Cl_2$ may be used for forming inwardly-tapered openings in the hardmask by shifting the mixture of the hardmask etching recipe towards greater generation of etch inhibitors. The inwardly-tapered openings of such a hardmask may then be used for creation of smaller width vias in an underlying interlayer dielectric layer.

By way of a further example, it may be understood that the via reduction results (AEI's) of experiments such as represented by the graphs of FIGS. 3A-3C may be integrated into a computer program. Optimizing algorithms may be devised for finding the least error recipes for mass production of a desired amount of via width reduction. Then, when designers want to obtain a predetermined amount of via width reduction by using at least the ARC inward-tapering techniques disclosed herein; the designers can input the desired width reduction into the computer program and the program can automatically generate a computed recipe for achieving the desired amount of width reduction. The computer generated recipe may then be supplied to one or more programmable etch tools for realizing the computed inward-tapering of the ARC openings and the corresponding reduction of via width without altering the ILD-0/1 photomask. Therefore, a computer-readable medium or another form of a software product or machine-instructing means (including but not limited to, a hard disk, a compact disk, a flash memory stick, a downloading of manufactured instructing signals over a network and/or like software products) may be used in accordance with the present disclosure for instructing an instructable machine (e.g., a programmable etch tool) to carry out an etch recipe which includes the formation of substantial inward-tapering of ARC openings.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A method for forming vias through an interlayer dielectric region of a monolithically integrated device where the interlayer dielectric region (ILD) is structured to separate a first conductive layer from a second conductive layer of the monolithically integrated device, the method comprising:
   (a) providing an organic Anti-Reflection Coating layer (ARC layer) above the material of the ILD;
   (b) providing a photoresist layer above the ARC layer, where the photoresist layer includes a plurality of first openings defined therethrough;
   (c) creating from the first openings, a plurality of second openings extending through the organic ARC layer, where the second openings have inwardly-tapered sidewalls such that bottom width dimensions of the second openings are smaller than corresponding width dimensions of the first openings; and
   (d) creating from the second openings, a plurality of third openings extending through the ILD material;
   wherein said first conductive layer is part of an active layers set and wherein said second conductive layer defines a first major interconnect layer above said active layers set.

2. The method of claim 1 wherein:
   (b.1) said photoresist layer is composed of an organic material; and
   (c.1) said step of creating the second openings includes using an etch inhibitor which selectively adheres to organic surfaces.

3. The method of claim 1 wherein:
   (d.1) said step of creating the third openings includes causing isolated ones of said third openings to have bottom width dimensions, on average, of no more than about 0.20 μm.

4. The method of claim 1 wherein:
   (d.1) said step of creating the third openings includes causing densely-packed ones of said third openings to have bottom width dimensions, on average, of no more than about 0.18 μm.

5. The method of claim 1 wherein:
   (c.1) said step of creating the second openings includes causing the slopes of said inwardly-tapered sidewalls to be at least about four degrees or more away from a 90 degree vertical slope.

6. The method of claim 5 wherein:
   (c.1a) said step of creating the second openings includes causing the slopes of said inwardly-tapered sidewalls to be inwardly sloped in a range of about 7 degrees to about 40 degrees away from a 90 degree vertical slope.

7. The method of claim 6 wherein:
   (c.1b) said step of creating the second openings includes causing the slopes of said inwardly-tapered sidewalls to be inwardly sloped in a range of about 7 degrees to about 22 degrees away from a 90 degree vertical slope.

8. The method of claim 1 wherein:
   (d.1) said step of creating the third openings includes causing said third openings to have sidewall profiles that are not sloped by more than about 3 degrees away from a 90 degree vertical slope.

9. The method of claim 1 wherein:
   (d.1) said step of creating the third openings includes creating a reactive ion plasma having a carbon-providing component, having a fluorine-providing component, and having an inert bombardment component.

10. The method of claim 9 wherein:
    (d.1a) the carbon-providing component includes carbon monoxide (CO).

11. The method of claim 9 wherein:
    (d.1a) the fluorine-providing component includes $C_4F_6$.

12. The method of claim 9 wherein:
    (d.1a) the inert bombardment component includes argon (Ar).

13. The method of claim 1 wherein:
    (d.1) said third openings have bottom width dimensions, on average, that are at least 5 percent smaller than corresponding bottom width dimensions of corresponding first openings in the photoresist layer.

14. The method of claim 13 wherein:
    (d.2) said third openings have bottom width dimensions, on average, that are at least 10 percent smaller than the corresponding bottom width dimensions of the corresponding first openings in the photoresist layer.

15. The method of claim 1 and further comprising:
    (e) using a predefined photomask to define width dimensions of the first openings; and
    (f) using the same predefined photomask to manufacture additional monolithically integrated devices each having a respective version of said ILD region, of said photoresist layer and of said ARC layer with inwardly-tapered openings, but where at least two of the monolithically integrated devices that are manufactured by use of said same predefined photomask have substantially differently dimensioned widths for their corresponding, third openings extending through their corresponding ILD regions and have substantially differently dimensioned widths for their corresponding, second openings.

16. The method of claim 15 and further comprising:
    (g) providing respective conductive plugs extending through said third openings of the respective monolithically integrated devices.

17. The method of claim 16 and further comprising:
    (h) providing patterned conductive layers above the corresponding ILD regions of the respective monolithically integrated devices.

18. The method of claim 17 wherein:
(h.1) at least two of said respective patterned conductive layers have substantially different plug spacings and/or substantially different spacings between corresponding conductive lines of their respective, patterned conductive layers.

19. The method of claim 1 wherein:
(d.1) said ILD includes a silicon-oxide based insulator having a thickness of about 0.1 µm or more.

20. The method of claim 1 wherein:
(b.1) said photoresist layer has a thickness of about 0.61 µm or less.

21. The method of claim 1 wherein:
(a.1) said organic ARC layer has a thickness of about 700 Å to 800 Å.

22. The method of claim 1 wherein:
at least two of said third openings are densely packed so as to have a spacing of no more than about 2000 nm between them.

23. A method for forming vias through an interlayer dielectric region of a monolithically integrated device where the interlayer dielectric region (ILD) is structured to separate a first conductive layer from a second conductive layer of the monolithically integrated device, the method comprising:
(a) providing an organic Anti-Reflection Coating layer (ARC layer) above the material of the ILD;
(b) providing a photoresist layer above the ARC layer, where the photoresist layer includes a plurality of first openings defined therethrough, wherein said photoresist layer is composed of an organic material;
(c) creating from the first openings, a plurality of second openings extending through the organic ARC layer, where the second openings have inwardly-tapered sidewalls such that bottom width dimensions of the second openings are smaller than corresponding width dimensions of the first openings; and
(d) creating from the second openings, a plurality of third openings extending through the ILD material; wherein
(c.1) said step of creating the second openings includes using an etch inhibitor which selectively adheres to organic surfaces, and
(c.2) said step of creating the second openings includes creating a reactive ion plasma having a hydrocarbon-providing component, having a fluorine-providing component, and having an inert bombardment component.

24. The method of claim 23 wherein:
(c.2a) the hydrocarbon-providing component includes $CHF_3$.

25. The method of claim 23 wherein:
(c.2a) the fluorine-providing component includes $CF_4$.

26. The method of claim 23 wherein:
(c.2a) the inert bombardment component includes argon (Ar).

27. The method of claim 23 wherein:
(c.2a) the hydrocarbon-providing component includes $CHF_3$;
(c.2b) the fluorine-providing component includes $CF_4$; and
(c.2c) the ratio in the reactive ion plasma of said $CF_4$ to said $CHF_3$, as measured by volumetric input flow is substantially less than five to one (5:1).

28. The method of claim 27 wherein:
(c.2c1) said $CF_4$ to $CHF_3$ ratio is about or less than three to one (3:1).

29. The method of claim 28 wherein:
(c.2c2) said $CF_4$ to $CHF_3$ ratio is about or less than one to one (1:1).

30. A contact forming method comprising:
(a) patterning an organic photoresist layer which is provided over an organic ARC layer, where the ARC layer is provided over a dielectric layer, the patterning of the photoresist layer causing through-holes to be defined in the photoresist layer;
(b) using an inwardly-tapering etch process to continue the through-holes of the lithography mask into the ARC layer as inwardly-tapered through-holes of the ARC layer;
(c) using an anisotropic etch process to continue the inwardly-tapered through-holes of the ARC layer into the dielectric layer as substantially vertical contact holes through the dielectric layer; and
(d) filling the substantially vertical contact holes with an electrical conductor.

31. The contact forming method of claim 30 wherein:
(b.1) said inwardly-tapering etch process causes etch inhibitors to adhere to sidewalls of the photoresist layer through-holes.

32. The contact forming method of claim 30 wherein:
(c.1) said anisotropic etch process causes etch inhibitors to adhere to sidewalls of the inwardly-tapered through-holes of the ARC layer.

33. The contact forming method of claim 30 wherein:
(d.1) said electrical conductor includes a refractory metal.

* * * * *